(12) United States Patent
Lin et al.

(10) Patent No.: US 8,664,062 B2
(45) Date of Patent: Mar. 4, 2014

(54) METHOD OF MANUFACTURING FLASH MEMORY CELL

(75) Inventors: Yung-Chang Lin, Taichung (TW); Nan-Ray Wu, Hsinchu (TW); Le-Tien Jung, New Taipei (TW)

(73) Assignee: Taiwan Memory Company, Hsinchu (TW)

( * ) Notice: Subject to any disclaimer, the term of this patent is extended or adjusted under 35 U.S.C. 154(b) by 280 days.

(21) Appl. No.: 13/047,758

(22) Filed: Mar. 14, 2011

(65) Prior Publication Data

US 2011/0244640 A1    Oct. 6, 2011

(30) Foreign Application Priority Data

Mar. 31, 2010    (TW) ................................ 99109893 A

(51) Int. Cl.
*H01L 21/336*    (2006.01)
*H01L 21/3205*    (2006.01)
*H01L 21/76*    (2006.01)

(52) U.S. Cl.
USPC ............ 438/261; 257/E21.294; 257/E21.422; 257/E21.54

(58) Field of Classification Search
USPC ................. 438/261, 424, 591; 257/E21.294, 257/E21.422, E21.54
See application file for complete search history.

(56) References Cited

U.S. PATENT DOCUMENTS

| | | | |
|---|---|---|---|
| 7,276,759 B1 | 10/2007 | Yu et al. | |
| 7,443,000 B2 * | 10/2008 | Mori | ............................. 257/411 |
| 7,544,566 B2 | 6/2009 | Yu et al. | |
| 7,834,388 B2 | 11/2010 | Yu et al. | |
| 2009/0087975 A1 * | 4/2009 | Tsai et al. | ..................... 438/593 |

* cited by examiner

*Primary Examiner* — Matthew W Such
*Assistant Examiner* — Monica D Harrison
(74) *Attorney, Agent, or Firm* — Winston Hsu; Scott Margo

(57) ABSTRACT

A method of manufacturing a flash memory cell includes providing a substrate having a first dielectric layer formed thereon, forming a control gate on the first dielectric layer, forming an oxide-nitride-oxide (ONO) spacer on sidewalls of the control gate, forming a second dielectric layer on the substrate at two sides of the ONO spacer, and forming a floating gate at outer sides of the ONO spacer on the second dielectric layer, respectively.

8 Claims, 11 Drawing Sheets

METHOD OF MANUFACTURING FLASH MEMORY CELL

BACKGROUND OF THE INVENTION

1. Field of the Invention

The invention relates to a method of manufacturing a flash memory cell, and more particularly, to a method of manufacturing 2-bits flash memory cell.

2. Description of the Prior Art

Nonvolatile memories are utilized in many electronics devices for storing configuration data or program data, etc. By having advantages of repeatable write, read, and erase operations and retaining their data values even after power is removed from the device, flash memory becomes one of the widely adopted non-volatile memories in electronics devices such as personal computers, personal digital assistants, digital cameras, and digital music players.

A conventional flash memory cell includes a stacked gate upwardly including a tunnel oxide layer, a floating gate for storing electric charges, a control gate for controlling the charging of the floating gate, and an oxide-nitride-oxide (ONO) multilayer positioned between the floating gate and the control gate. By applying a bias to the control gate and the source/drain, the electrons are transferred into or from the floating gate as performing the write or erase operations. And by using a threshold voltage fluctuation depending on whether there are charges in the floating gate, the flash memory cell may store data.

With a trend toward scaling down the size of the semiconductor device to deep sub-micron feature sizes, the memory cells are accordingly required to have high integration density. Meanwhile, since throughput and storage capacity of the electronic information products keep increasing, the memory cells are required to have not only higher integration density but also larger memory capacity and higher reliability. Therefore, a method to manufacture a flash memory cell with consideration to the abovementioned issues is still in need.

SUMMARY OF THE INVENTION

According to a first aspect of the present invention, a method of manufacturing flash memory cell is provided. The method includes steps of providing a substrate having a first dielectric layer formed thereon, forming a control gate on the first dielectric layer, forming an oxide-nitride-oxide (ONO) spacer on sidewalls of the control gate, forming a second dielectric layer on the substrate at two sides of the ONO spacer, and forming a floating gate at outer sides of the ONO spacer on the second dielectric layer, respectively.

According to a second aspect of the present invention, another method of manufacturing flash memory cell is provided. The method includes steps of providing a substrate having a memory region and a logic region defined thereon, forming a plurality of shallow trench isolations (STIs) on the substrate, forming at least a first gate respectively in the memory region and the logic region, forming an ONO spacer on sidewalls of the first gates respectively in the logic region and the memory region, forming a dielectric layer on the substrate, forming a second gate at least on outer sides of the ONO spacers in the memory region, forming a plurality of isolating patterns on the substrate, and performing an etching process to etch the second gate through the isolating patterns.

According to the method of manufacturing flash memory cell provided by present invention, the floating gate is individually formed at the two opposite sides of the control gate. In other words, two adjacent memory bit cells share one control gate. Accordingly, integration and memory capacity are both increased. Furthermore, because the method of manufacturing flash memory cell provided by present invention is easily integrated with conventional logic processes, reliability of the memory cells is improved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
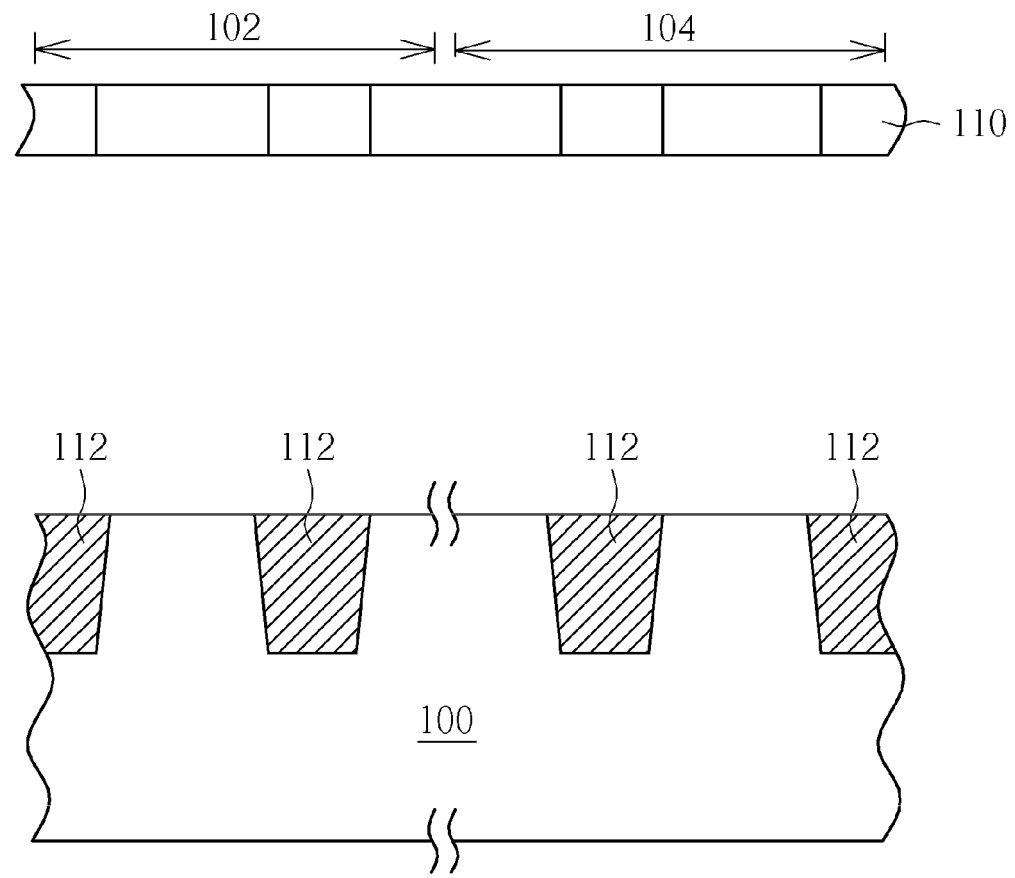
FIGS. 1-10 are schematic drawings illustrating a method of manufacturing flash memory cell provided by a first preferred embodiment of the present invention.
Figure 2:
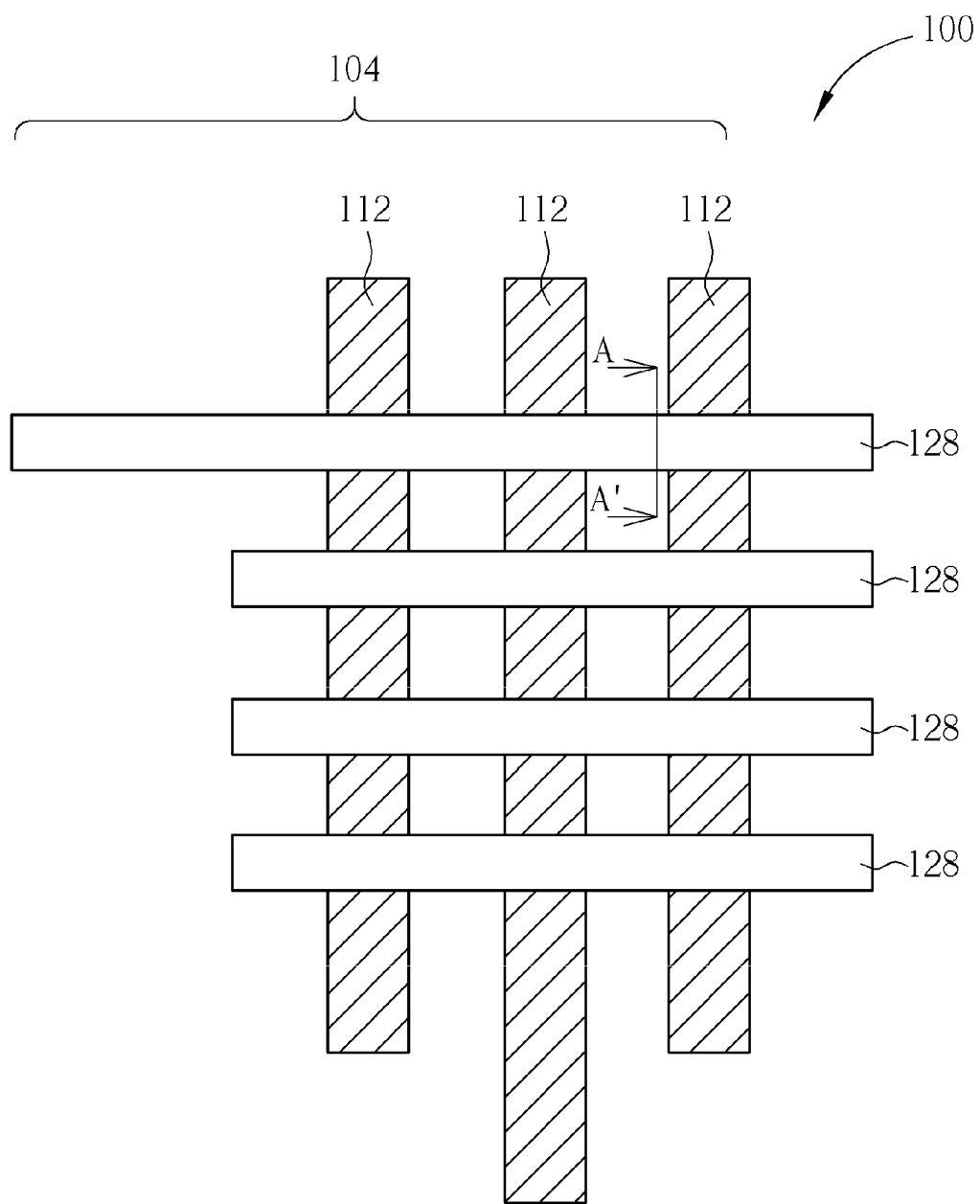

The schematic drawings as shown in FIGS. 1-10 illustrate a method of manufacturing flash memory cell provided by a first preferred embodiment of the present invention. Please refer to FIG. 1 and FIG. 2, the first preferred embodiment provides a substrate 100. The substrate 100 includes a logic region 102 and a memory region 104 defined thereon, and FIG. 2 is a top view of the memory region 104. Next, a photolithography process is performed with a photomask 110. Consequently, a plurality of shallow trench isolation (STI) regions (112) that are stripe-shaped and parallel with each other are defined on the substrate 100 in the memory region 104. An etching process is subsequently performed to form a plurality of shallow trenches (112) respectively in the STI regions. Then, the shallow trenches are filled with a dielectric layer formed on the substrate 100. Accordingly, a plurality of STIs 112 is formed in the substrate 100. After forming the STIs 112, ion implantations are performed to form n-type wells or p-type wells, or to adjust the threshold voltages of n-type transistors or p-type transistors. Since those ion implantations and steps for forming the STIs 112 are well-known to those skilled in the art, the details are omitted herein in the interest of brevity.

Figure 3:
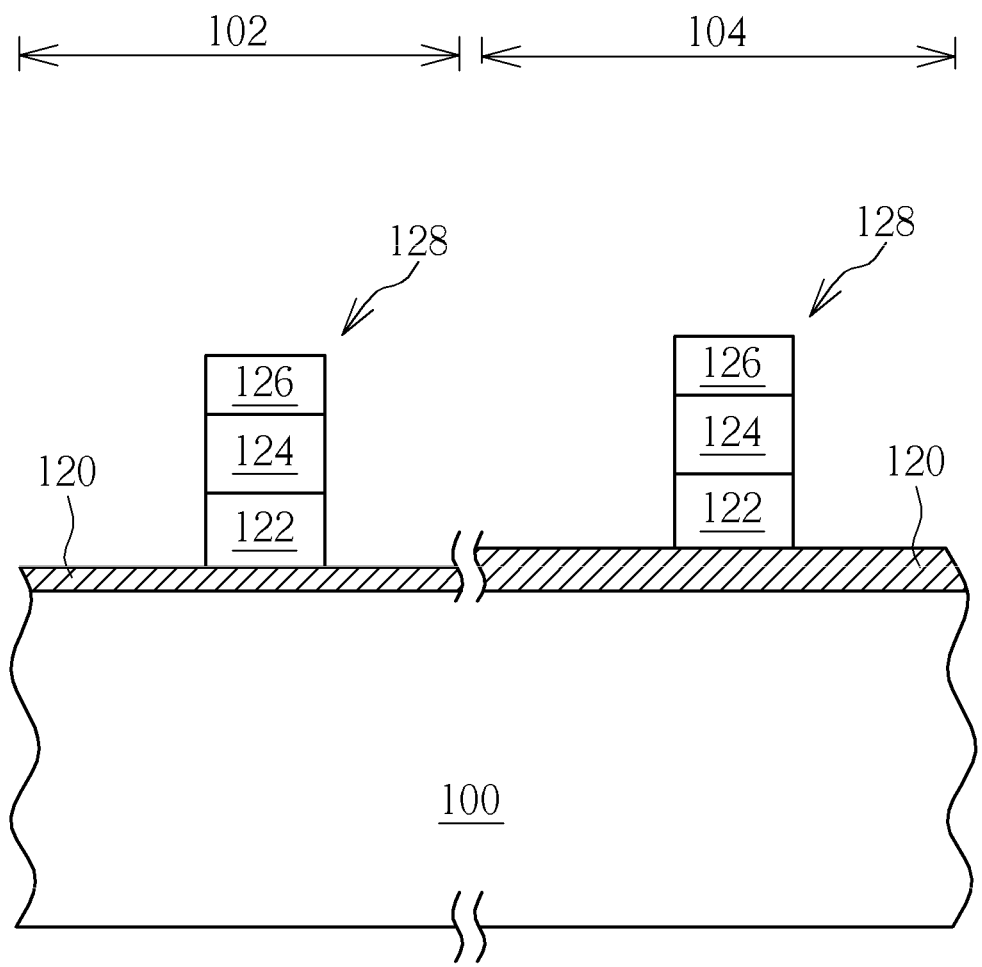

Please refer to FIGS. 2-7. It should be noted that the memory region 104 shown in FIGS. 3-7 are cross-sectional views taken along A-A' in FIG. 2. As shown in FIG. 3, a first dielectric layer 120 is formed on the substrate 100. According to the preferred embodiment, the memory cells and the logic circuit devices are integrated and fabricated in a single chip, therefore a thickness of the first dielectric layer 120 in the logic region 102 and the memory region 104 is different as shown in FIG. 3 due to different performances requirement and voltages applied to the memory cells and the logic circuit devices. For example, a thickness of the first dielectric layer 120 in the memory region 104 is exemplarily 330 angstroms (Å) and a thickness of the first dielectric layer 120 in the logic region 102 is exemplarily between 90-330 angstroms. Additionally, the first dielectric layer 120 in the logic region 102 can be 90-120 angstroms or 330 angstroms depending on requirements to devices. However, those skilled in the art would easily realize that the thickness of the first dielectric layer 120 in the logic region 102 and the memory region 104 is not limited to this.

Please still refer FIG. 2 and FIG. 3. Next, a polysilicon layer is formed on the first dielectric layer 120 and followed by performing an n-type or p-type ion implantation depending on requirements. Consequently an n-type or p-type doped polysilicon layer 122 is obtained. However, it is not limited to form the doped polysilicon layer 122 by deposition instead of ion implantation. Then, a conductive layer 124 including metal is formed on the doped polysilicon layer 122. The conductive layer 124 includes titanium nitride (TiN), tungsten (W), tungsten silicide (WSi), or combinations thereof. A patterned hard mask 126 is subsequently formed on the conductive layer 124 and followed by performing an etching process to etch the conductive layer 124 and the doped polysilicon layer 122. The etching process is stopped at the first dielectric layer 120 and thus at least a first gate 128 is formed respectively in the logic region 102 and the memory region 104 on the substrate 100 as shown in FIG. 3. The first gate 128 serves as a control gate of a memory cell and a word line (WL) as shown in FIG. 2. For clarifying the spatial relationship between the first gates/WLs 128 and the STIs 112, the STIs 112 actually covered by the first dielectric layer 120 and the first gates/WLs 128 are emphatically shown in FIG. 2 while the first dielectric layer 120 is omitted from FIG. 2. However, it should be realized that the first dielectric layer 120 exists and covers the STIS 112 and areas between the STIs 112.

Figure 4:
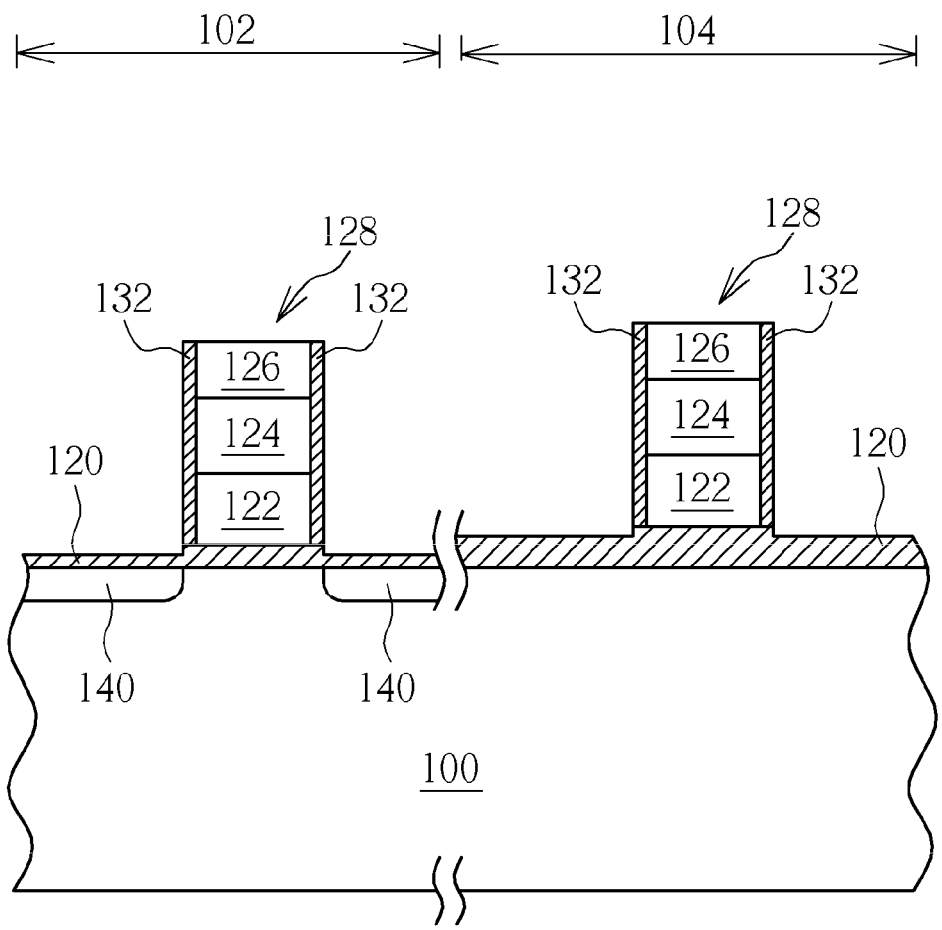

Please refer to FIG. 4. Next, a silicon oxide ($SiO_2$) layer 132 is formed on the substrate 100 and sidewall of the first gate 128, and a thickness of the Silicon oxide layer 132 is exemplarily 60 angstroms, but not limited to this. Thereafter, an anisotropic etching back process is performed to remove a horizontal portion of the silicon oxide layer 132 and to form a silicon oxide spacer, also recognized as a first spacer (spacer-1) 132 on sidewalls of each first gate 128. After forming the first spacer 132, an n-type or p-type ion implantation is performed to form n-type or p-type light-doped drains (LDDs) 140 in the substrate 100 at two sides of the first gate 128 in the logic region 102.

Figure 5:
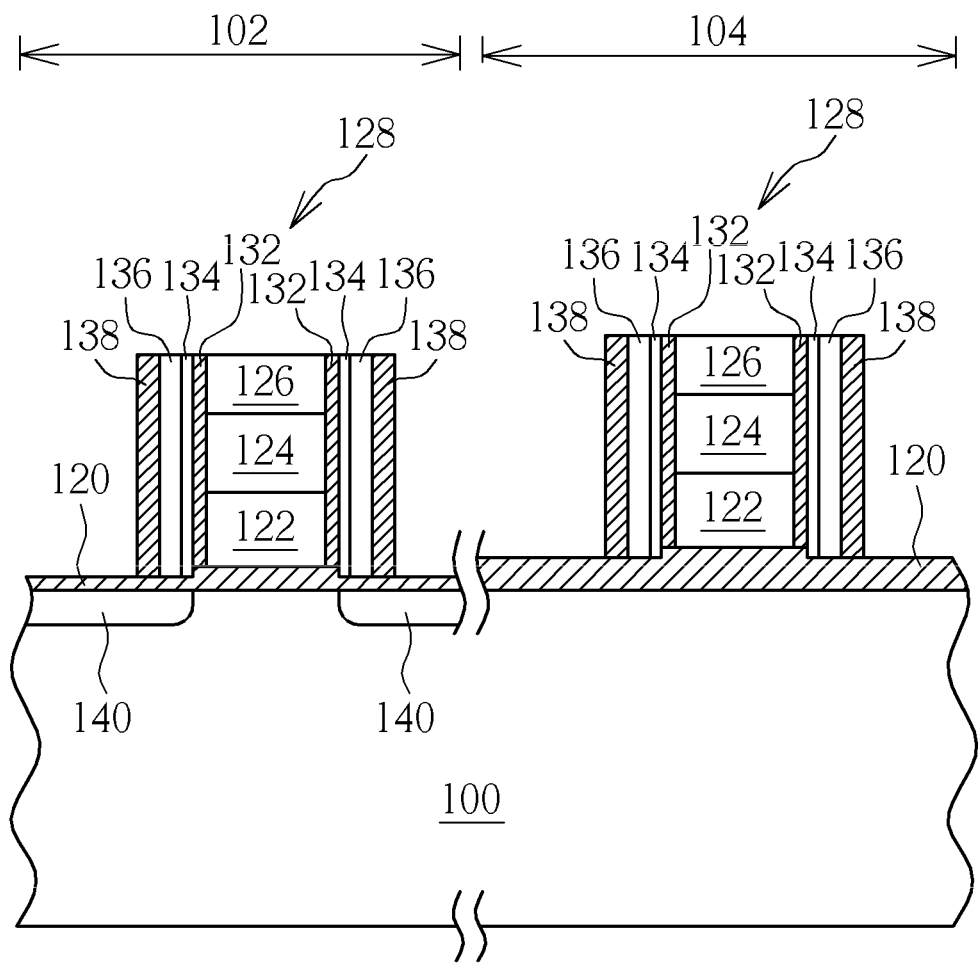

Please refer to FIG. 5. Subsequently, a silicon nitride layer 134, an undoped polysilicon layer 136 and a protecting layer 138 which provides insulation are sequentially formed on the substrate 100. The protecting layer 138 exemplarily includes silicon oxide, but not limited to this. It is noteworthy that the silicon nitride layer 134, the undoped polysilicon layer 136, and the protecting layer 138 cover the silicon oxide layer 132. In other words, the silicon nitride layer 134, the undoped polysilicon layer 136, and the protecting layer 138 cover the first gate 128 and the first spacer 132. Then, at least an anisotropic etching back process is performed by one time or several times to remove a portion of the protecting layer 138, the undoped polysilicon layer 136 and the silicon nitride layer 134. Consequently, the remained protecting layer 138, undoped polysilicon layer 136, and silicon nitride layer 134 are left on outer sides of the first spacer 132 as shown in FIG. 5. The silicon oxide layer 132, the silicon nitride layer 134 and the undoped polysilicon layer 136 serve as an oxide-nitride-silicon (ONS) spacer, also recognized as a second spacer. In particular, outer sides of the ONS spacer are protected from the abovementioned etching process by the protecting layer 138.

Figure 6:
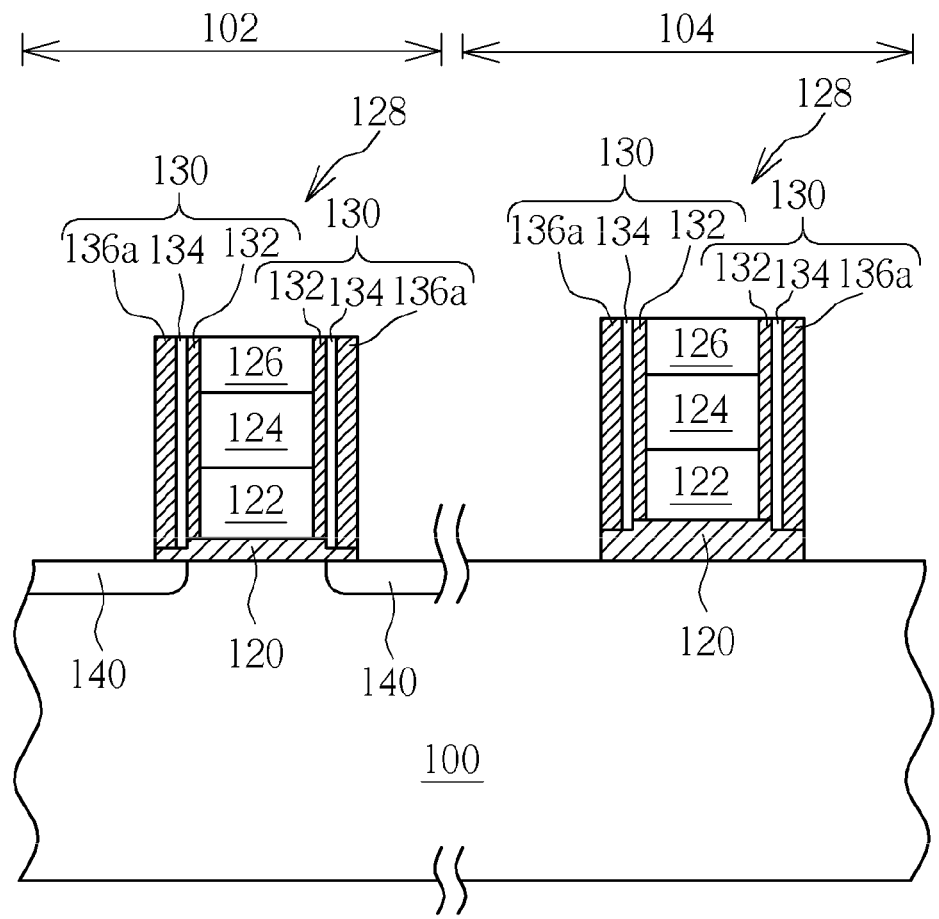

Please refer to FIG. 6. Next, a cleaning process is performed to remove the protecting layer 138 with dilute hydrofluoric acid (DHF). It is noteworthy that because both of the protecting layer 138 and the first dielectric layer 120 includes silicon oxide, the first dielectric layer 120 not covered by the first gate 128, the silicon oxide layer 132, the silicon nitride layer 134, and the undoped polysilicon layer 136 is removed simultaneously in the cleaning process. Due to different etching rates, the undoped polysilicon layer 136 is impervious to the cleaning process used to remove the protecting layer 138 and the first dielectric layer 120. Subsequently, an oxidation process is performed to oxidize the undoped polysilicon layer 136. Accordingly, a silicon oxide layer 136a is formed and thus an oxide-nitride-oxide (ONO) spacer 130 including the silicon oxide layer 136a, the silicon nitride layer 134, and the silicon oxide layer 132 is obtained on the sidewalls of the first gate 128.

Please still refer to FIG. 6. In a modification to the preferred embodiment, after forming the first spacer 132 and forming the n-type or p-type LDDs 140 by the ion implantation, a silicon nitride layer 134 and another silicon oxide layer 136a are sequentially formed covering the first spacer 132 and the first gate 128 on the substrate 100, and followed by performing an anisotropic etching back process. Consequently, an ONO spacer 130 including the silicon oxide layer 132, the silicon nitride layer 134 and the silicon oxide layer 136a is obtained. According to the abovementioned modification, the steps of forming the protecting layer 138, removing the protecting layer 138 and performing the oxidation process for oxidizing the undoped polysilicon layer 136 are all economized, and thus the process cost is further reduced.

Figure 7A:
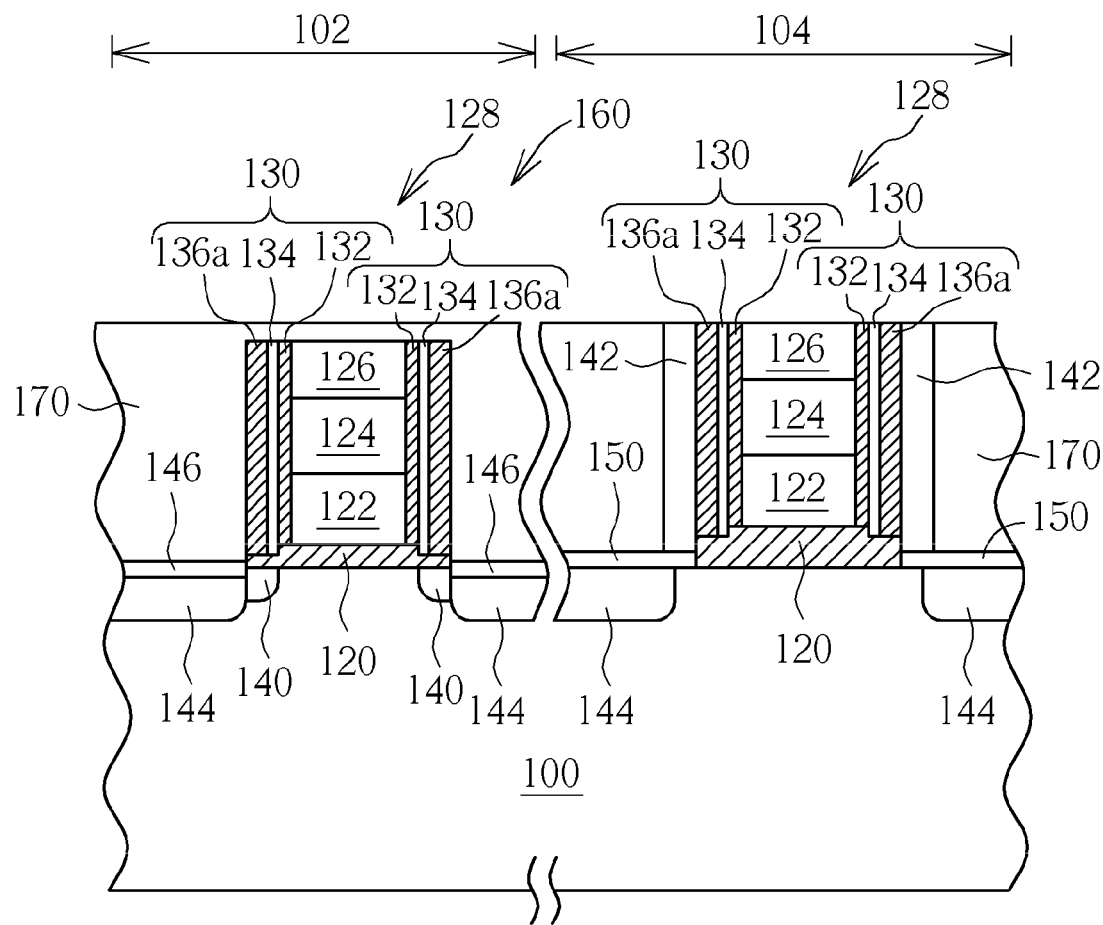
FIG. 7B is a schematic drawing illustrating a method of manufacturing flash memory cell provided by a second preferred embodiment of the present invention.

Please refer to FIG. 7A. Next, another cleaning process is performed to the substrate 100 with the DHF and followed by forming a second dielectric layer 150 on the substrate 100. A thickness of the second dielectric layer 150 is about 60-90 angstroms. Thereafter, a doped polysilicon layer such as an n-type doped polysilicon layer is formed on the substrate 100. The doped polysilicon layer is then etched back by another anisotropic etching back process, and thus a second gate 142 is respectively formed on outer sides of each ONO spacer 130. In other words, The ONO spacer 130 is positioned in between the first gate 128 and the second gate 142 for providing electrical isolation. Furthermore, a hard mask is formed after forming the second gate 142. The hard mask renders protection to the first gate 128, the ONO spacer 130, and the second gate 142 in the memory region 104 during an isotropic etching process, which is performed to remove the second gate 142 in the logic region 102. Accordingly, the second gate 142 in the memory region 104 serves as a floating gate of a flash memory cell and the second dielectric layer 150 serves as a tunnel dielectric layer. After the isotropic etching process, an n-type or p-type ion implantation is performed to form an n-type or p-type source/drain 144 in the substrate 100 at two sides of the ONO spacer 130 in the logic region 102. Simultaneously, an n-type or p-type source/drain 144 is formed in the substrate 100 at two sides of the second gate 142 in the memory region 104. Accordingly, a logic device 160 is formed in the logic region 102. After forming the source/drain 144, a silicide process is performed to form a silicide 146 respectively on the source/drain 144 in the logic region 102. It is well-known that the silicides 146 are formed to provide superior Ohmic contact. Subsequently, an interlayer dielectric (ILD) layer 170 is formed on the substrate 100.

Figure 7B:
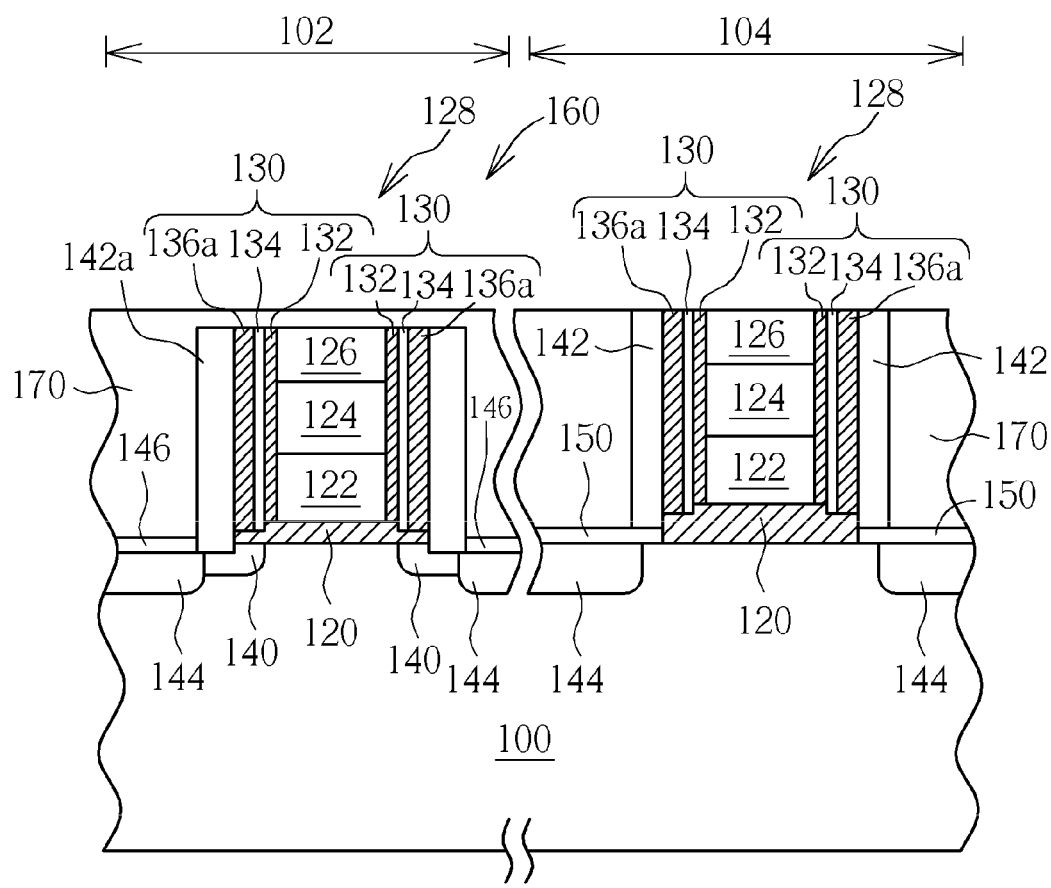

In addition, please refer to FIG. 7B, which is a schematic drawing illustrating a method of manufacturing flash memory cell provided by a second preferred embodiment of the present invention. It is noteworthy that in the second preferred embodiment, steps identical with the first preferred embodiment are omitted for the sake of simplicity, and the same elements in both the first and second preferred embodiments are designated by the same numerals. The difference between the first preferred embodiment and the second preferred embodiment is that the isotropic etching process, which is performed to remove the second gate 142 in the logic region 102, is eliminated. Therefore, the doped polysilicon layer is left on the outer sides of each ONO spacer 130 both in the logic region 102 and the memory region 104. Accordingly, the doped polysilicon layer left on the outer sides of the ONO spacer 130 in the memory region 104 serves as the second gate 142 while the doped polysilicon layer left on the outer sides of the ONO spacer 130 in the logic region 102 serves as a third spacer 142a. After forming the second gate 142 and the third spacer 142a, an n-type or p-type ion implantation is performed to form an n-type or p-type source/drain 144 in the substrate 100 at two sides of the third spacer 142a in the logic region 102. Simultaneously, an n-type or p-type source/drain 144 is formed in the substrate 100 at two sides of the second gate 142 in the memory region 104. Accordingly, a logic device 160 is formed in the logic region 102. As mentioned above a silicide process is performed to form a silicide 146 respectively on the source/drain 144 in the logic region 102 after the ion implantation, and an ILD layer 170 is formed on the substrate 100. According to the second preferred embodiment, the doped polysilicon layer left on the outer sides of the ONO spacer 130 in the logic region 102 serves as the third spacer 142a, therefore the total width of the spacers (including the ONO spacer 130 and the third spacer 142a) is larger. Consequently, it is ensured that the profile of the source/drain 144 in the logic region 102 satisfying the rule requirement.

It is noteworthy that according to the second preferred embodiment, as shown in FIG. 7B, both of the gate stack of the logic device 160 and the gate stack of the memory cell include the first dielectric layer 120, the doped polysilicon layer 122, the conductive layer 124, the patterned hard mask 126, the ONO spacers 130, and the doped polysilicon layer serving as the second gate 142 in the memory region 104 and the third spacer 142a in the logic region 102. In other words, the gate stacks of the logic device 160 and of the memory cell in both logic region 102 and the memory region 104 are almost identical to each other according to the second preferred embodiment.

Figure 8:
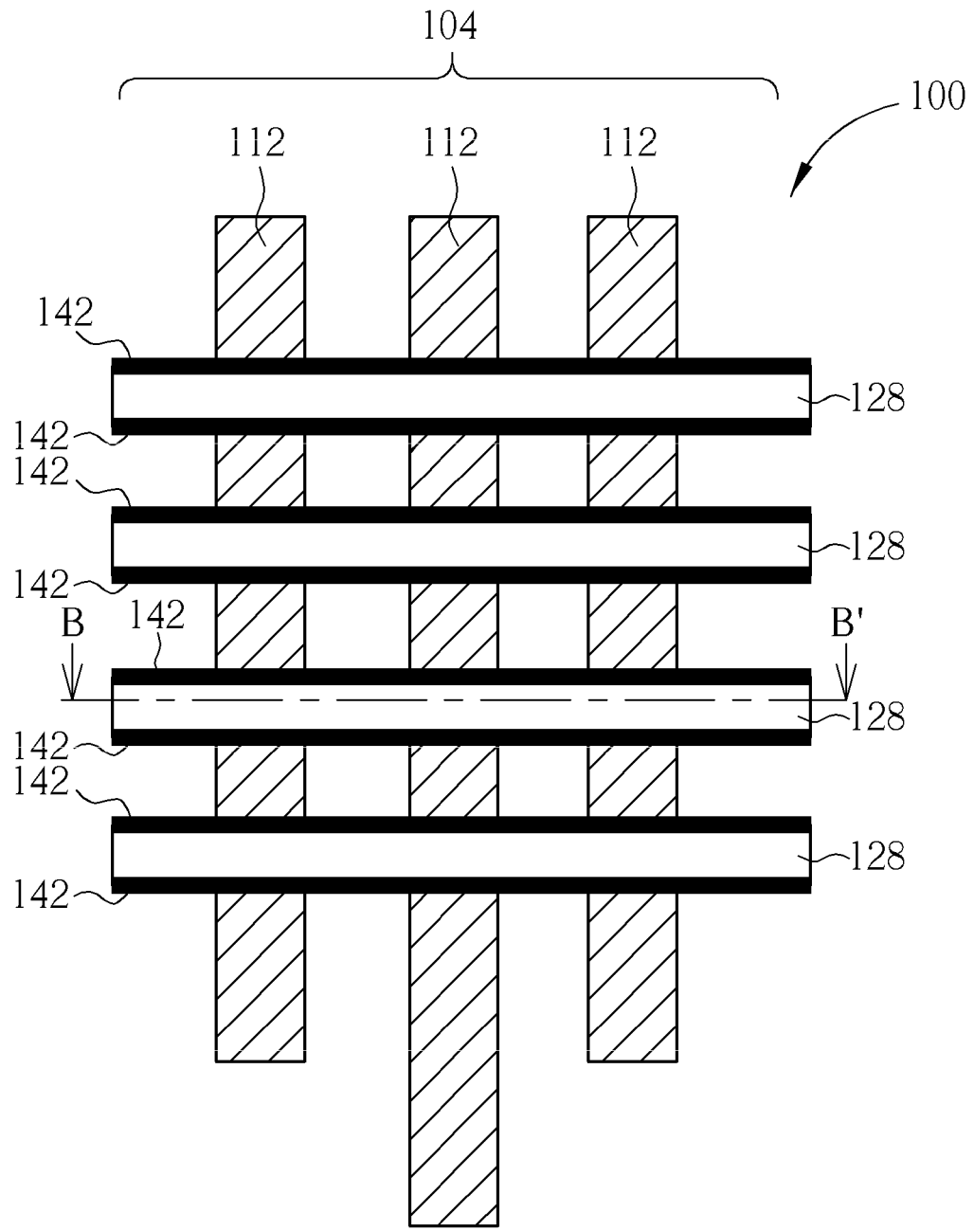

Please refer to FIG. 8, which is a top view of the memory region 104 after forming the logic device 160 and the second gate 142. It is noteworthy that for clarifying the spatial relationship between the first gates 128, the second gates 142, and the STIs 112, only the first gates 128, the second gates 142 and the STIs 112 are emphatically shown in FIG. 8 while the ONO spacers 130 and the ILD layer 170 are omitted from FIG. 8. As shown in FIG. 8, the second gates 142 are positioned at the two opposite sides of the first gates (the word lines) 128 in the memory region 104, and the second gates 142 at each side of the first gates 128 are electrically connected.

Figure 10:
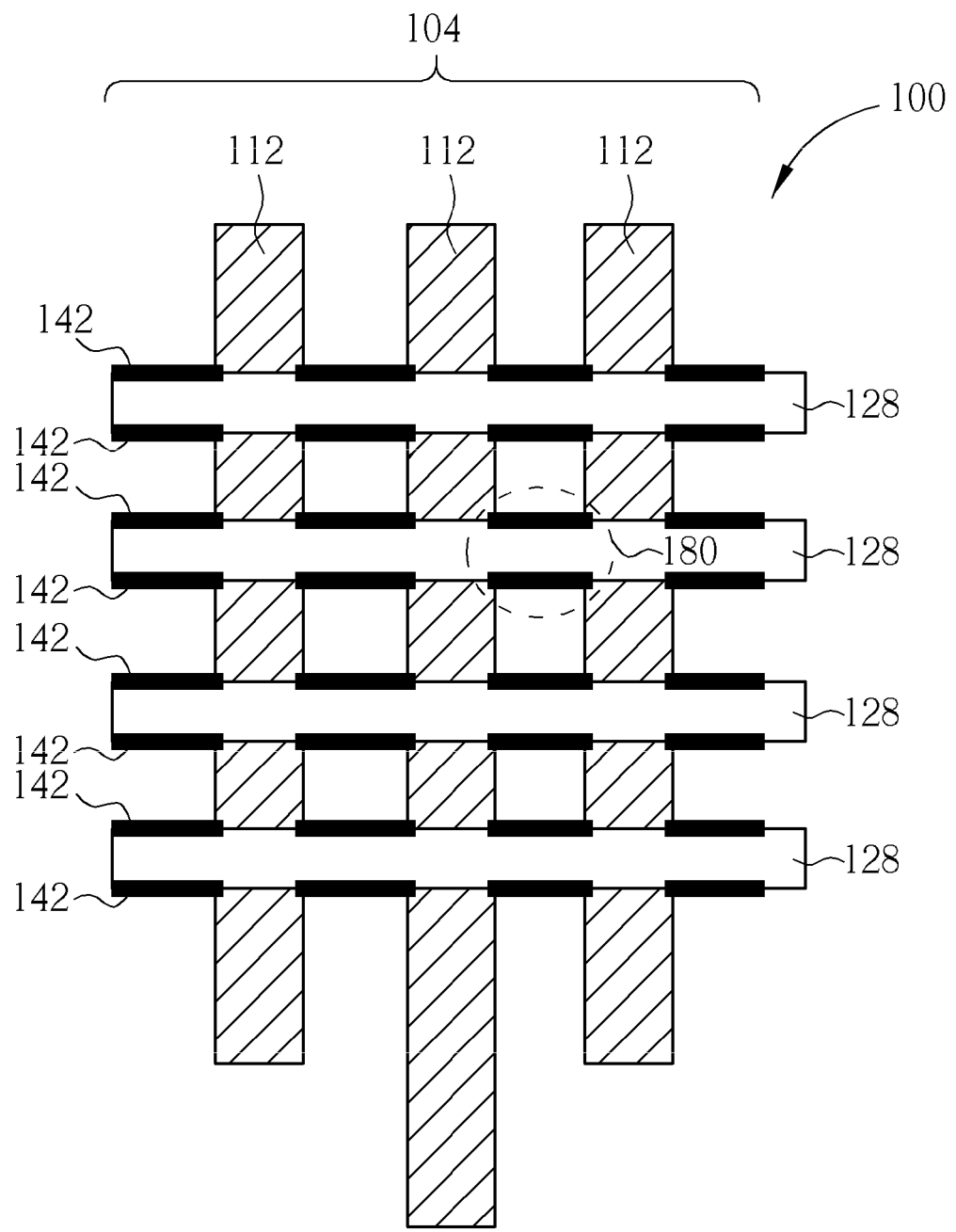

Please refer to FIG. 10. After forming the second gates 142 at the two opposite sides of the first gate (the word lines) 128 in the memory region 104, a patterned photoresist layer (not shown) is formed on the substrate 100 and followed by performing an etching process. The etching process is performed to etch the second gate 142 with the patterned photoresist serving as an etching hard mask. As shown in FIG. 10, after the etching process, the strip-shaped second gate 142 is broken at areas substantially corresponding to each STI 112. After the etching process, at least a 2-bits memory cell 180 is fabricated.

Figure 9:
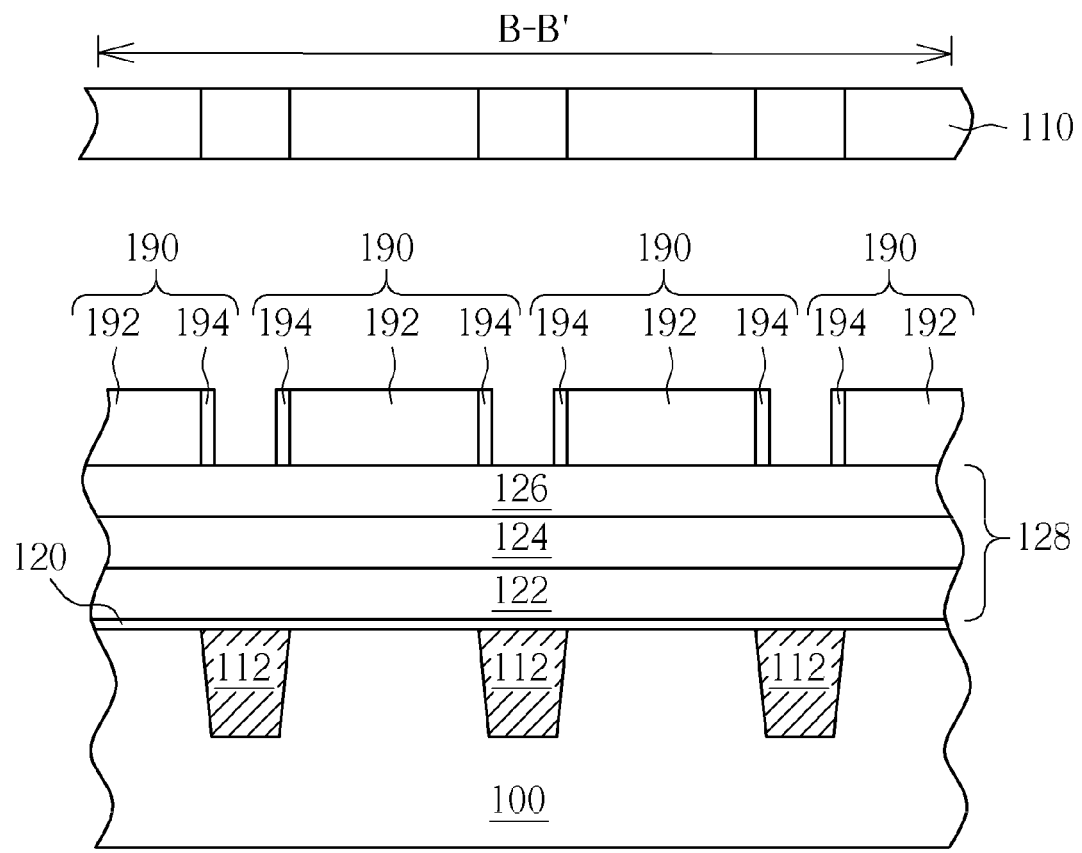

Please refer to FIG. 9, which is a cross-sectional view taken along B-B' line in FIG. 8 and illustrates a modification to the preferred embodiments. According to the modification, a plurality of isolating patterns 190 is formed on the substrate 100 by the following steps: a hard mask layer, such as a silicon nitride/silicon oxide multi-layer or a polysilicon/silicon oxide multi-layer, is formed on the substrate 100 and followed by performing a photolithography and an etching processes to pattern the hard mask layer and to form a plurality of patterned hard masks 192. It is noteworthy that the photomask 110 used to define the STI regions is utilized in the current photolithography process again. Therefore, the hard mask layer corresponding to the STI regions is removed. Since the photomask 110 is used in both of the photolithography processes for defining the STI regions and the patterned hard masks 192, extra photomask and/or photomask design is never needed. Thus the process cost is further economized. Furthermore, it is required that a width of the isolating patterns 190 must be larger than a spacing distance between each of the STIs 112, such that the control ability of the second gate 142 to the channel region is ensured. Therefore, a silicon nitride layer is further formed on the substrate 100 after forming the patterned hard mask 192 and followed by performing an etching back process to remove a portion of the silicon nitride layer. Consequently, a hard mask spacer 194 is respectively formed on sidewalls of each patterned hard mask 192. The patterned hard mask 192 and the hard mask spacers 194 construct the isolating patterns 190. As shown in FIG. 9, the hard mask spacer 194 of the isolating patterns 190 covers a portion of the STI 112. Due to the hard mask spacer 194, the width of the isolating patterns 190 is ensured to be larger than the spacing distance between the STIs 112.

Please refer to FIG. 10. Thereafter, an etching process is performed to etch the second gate 142 with the isolating patterns 190 serving as an etching hard mask. As shown in FIG. 10, after the etching process, the strip-shaped second gate 142 is broken at areas corresponding to each STI 112. It is noteworthy that since the hard mask spacer 194 of the isolating patterns 190 covers a portion of the STI 112, the second gate 142 overlapping to the STI 112 is remained on the STI 112 after the etching process as shown in FIG. 10. Please refer to FIG. 9 and FIG. 10 again. During removing the second gate 142 overlapping to the STI 112, any alignment mistake or over etching would make a length of the second gate 142 smaller than the spacing distance between the STIs 112, and thus the second gate 142, that is the floating gate, loses its control ability to the channel region. What is noticeable is that according to the preferred embodiments, the hard mask spacers 194 of the isolating patterns 190 are provided by make sure that the length of the second gate 142 is larger than the spacing distance between the STIs 112. Accordingly, control ability of the floating gate 142 to the underneath channel region is improved. After the etching process, at least a 2-bits memory cell 180 is fabricated.

According to the method of manufacturing flash memory cell provided by present invention, the floating gate is individually formed at the two sides of each first gate, that is the control gate, after the etch processes as mentioned above. In other words, two adjacent memory bit cells share one control gate. By applying operating voltage to the control gate, the two floating gates of the flash memory cell are operated. Accordingly, integration density and memory capacity of the provided memory cell are both increased. Furthermore, because the method of manufacturing flash memory cell provided by present invention is easily integrated in the logic processes, therefore the logic devices in the logic region and the 2-bits memory cells in the memory region are simultaneously fabricated without adding further photomask. Accordingly, reliability of the memory cells is improved. Additionally, the gate stacks of the logic devices and of the 2-bits memory cells can be made identical to each other according to the present invention. It is also noteworthy that the method of manufacturing flash memory cell is a gate first process, and it is more preferable for manufacturing embedded flash memory cells compared to the prior art.

Those skilled in the art will readily observe that numerous modifications and alterations of the device and method may be made while retaining the teachings of the invention.

What is claimed is:

1. A method of manufacturing flash memory cell comprising steps of:
   providing a substrate having a first dielectric layer formed thereon;
   forming a control gate on the first dielectric layer;
   forming an oxide-nitride-oxide (ONO) spacer on sidewalls of the control gate, the ONO spacer being spaced apart from the substrate by the first dielectric layer;
   forming a second dielectric layer on the substrate at two sides of the ONO spacer; and
   forming a floating gate at outer sides of the ONO spacer on the second dielectric layer, respectively.

2. The method of manufacturing flash memory cell according to claim 1, wherein the step of forming the ONO spacer further comprises:
   forming a silicon oxide spacer on the sidewalls of the control gate;
   forming a silicon nitride layer, an undoped polysilicon layer and a protecting layer covering the silicon oxide spacer on the substrate, sequentially;
   etching back the silicon nitride layer, the undoped polysilicon layer, and the protecting layer to form an oxide/nitride/polysilicon (ONS) spacer on the sidewalls of the control gate;
   performing a cleaning process to remove the protecting layer; and
   performing an oxidation process to oxidize the undoped polysilicon layer to form a silicon oxide layer and the ONO spacer.

3. The method of manufacturing flash memory cell according to claim 1, wherein the step of forming the ONO spacer further comprises:
   forming a silicon oxide spacer on the sidewalls of the control gate;
   forming a silicon nitride layer and a silicon oxide layer covering the silicon oxide spacer on the substrate, sequentially; and
   etching back the silicon nitride layer and the silicon oxide layer to form the ONO spacer on the sidewalls of the control gate.

4. The method of manufacturing flash memory cell according to claim 1, wherein a thickness of the second dielectric layer is about 60-90 angstroms.

5. The method of manufacturing flash memory cell according to claim 1, wherein a thickness of the first dielectric layer is different from a thickness of the second dielectric layer.

6. The method of manufacturing flash memory cell according to claim 1, wherein the control gate comprises a polysilicon layer and a metal layer.

7. The method of manufacturing flash memory cell according to claim 6, wherein the metal layer comprises titanium nitride (TiN), tungsten (W), tungsten silicide (WSi), or combinations thereof.

8. The method of manufacturing flash memory cell according to claim 1, wherein the floating gate comprises a doped polysilicon layer.

* * * * *